(12) United States Patent
Lasser

(10) Patent No.: US 8,595,445 B2
(45) Date of Patent: *Nov. 26, 2013

(54) NON-VOLATILE MEMORY AND METHOD WITH HOST CONTROLLED CACHING

(75) Inventor: Menahem Lasser, Kohav Yair (IL)

(73) Assignee: Sandisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/419,733

(22) Filed: Mar. 14, 2012

(65) Prior Publication Data

US 2012/0173807 A1      Jul. 5, 2012

Related U.S. Application Data

(63) Continuation of application No. 12/767,094, filed on Apr. 26, 2010, now Pat. No. 8,145,830, which is a continuation of application No. 11/651,494, filed on Jan. 10, 2007, now Pat. No. 7,711,890.

(60) Provisional application No. 60/803,983, filed on Jun. 6, 2006.

(51) Int. Cl.
  *G06F 13/00*      (2006.01)
(52) U.S. Cl.
  USPC ............... 711/145; 365/185.11; 365/185.29; 365/185.33; 711/103
(58) Field of Classification Search
  USPC ............... 711/103, 154; 365/185.11, 185.29, 365/185.33
  See application file for complete search history.

(56) References Cited

U.S. PATENT DOCUMENTS

| | | |
|---|---|---|
| 5,341,339 A | 8/1994 | Wells |
| 5,388,083 A | 2/1995 | Assar et al. |
| 5,404,485 A | 4/1995 | Ban |
| 5,568,423 A | 10/1996 | Jou et al. |
| 5,712,819 A | 1/1998 | Harari |
| 5,930,167 A | 7/1999 | Lee et al. |
| 5,937,425 A | 8/1999 | Ban |
| 5,963,480 A | 10/1999 | Harari |
| 6,148,354 A | 11/2000 | Ban et al. |
| 6,230,233 B1 | 5/2001 | Lofgren et al. |
| 6,570,790 B1 | 5/2003 | Harari |
| 6,831,865 B2 | 12/2004 | Chang et al. |
| 7,266,017 B2 | 9/2007 | Harari et al. |
| 8,145,830 B2 | 3/2012 | Lasser |
| 2001/0026472 A1 | 10/2001 | Harari et al. |
| 2004/0199727 A1 | 10/2004 | Narad |
| 2007/0061502 A1 | 3/2007 | Lasser et al. |
| 2007/0136523 A1 | 6/2007 | Bonella et al. |
| 2007/0234183 A1 | 10/2007 | Hwang et al. |
| 2007/0283081 A1 | 12/2007 | Lasser |

OTHER PUBLICATIONS

EPO/ISA, "Notification Concerning Transmittal of International Preliminary Report on Patentability (Chapter I of the Patent Cooperation Treaty), Written Opinion," corresponding International Patent Application No. PCT/IL2007/000681, mailed on Dec. 24, 2008, 10 pages.

*Primary Examiner* — Reba I Elmore
(74) *Attorney, Agent, or Firm* — Davis Wright Tremaine LLP

(57) ABSTRACT

A flash memory device includes a storage area having a main memory portion and a cache memory portion storing at least one bit per cell less than the main memory portion; and a controller that manages data transfer between the cache memory portion and the main memory portion according to at least one caching command received from a host. The management of data transfer, by the controller, includes transferring new data from the host to the cache memory portion, copying the data from the cache memory portion to the main memory portion and controlling (enabling/disabling) the scheduling of cache cleaning operations.

14 Claims, 2 Drawing Sheets

NON-VOLATILE MEMORY AND METHOD WITH HOST CONTROLLED CACHING

CROSS-REFERENCE TO RELATED APPLICATIONS

This patent application is a continuation of application no. 12/767,094, filed on Apr. 26, 2010, now U.S. Patent No. 8,145,830, which is a continuation of application no. 11/651,494, filed on Jan. 10, 2007, now U.S. Patent No. 7,711,890, which application claims the benefit of Provisional Application no. 60/803,983, filed on Jun. 6, 2006, which applications are incorporated herein in their entirety by this reference.

FIELD OF THE INVENTION

The present invention relates generally to the field of non-volatile memory devices. More particularly, the present invention relates to controlling operation of a cache memory implemented in a non-volatile memory device.

BACKGROUND OF THE INVENTION

In the present invention the terms "memory" and "storage" are used interchangeably and have the same meaning. Consequently compound phrases containing those two terms (like "memory device" and "storage device", or "memory system" and "storage system") also have the same meaning.

In the present invention the terms "controlling mechanism" and "controller" are used interchangeably and have the same meaning.

A flash memory system implemented as a Multi-Level Cell (MLC) flash memory is provided for storing more than one bit of data on each memory cell. The writing of data into an MLC flash memory is typically slower than the writing of data into a Single-Level Cell (SLC) flash memory that stores only one bit of data per cell. Therefore, a storage system based on an MLC flash memory might not be capable of recording a stream of incoming data transmitted to it at a higher writing rate.

Typically in cases where data is produced at a rate too high to be directly stored, a cache memory mechanism is provided and designed to operate fast enough to handle the incoming data stream. The cache memory utilizing a second (and faster) memory is implemented between the input data source and the main (and slower) memory of the flash memory device. The input data stream is first written into the faster cache memory, and at a later stage is copied from this faster cache memory into the main memory. As the copying operation between the cache memory and the main memory is typically performed in the background, this operation does not have to meet the strict performance conditions imposed by the input data stream rate, and therefore the lower write performance of the main memory is no longer an obstacle.

However, the implementation of a second memory for caching has its drawbacks. Such implementation requires additional components for the cache memory and its control, whereby complicating the design and management of the memory system.

The prior art include U.S. Pat. No. 5,930,167 to Lee et al., which discloses a memory method and system for caching write operations in a flash memory storage system while achieving the benefits of caching in MLC flash memories but with less of the disadvantages. The MLC flash memory media of the Lee patent is configured to operate as its own cache memory. This is possible since memory cells that store multiple bits can be further implemented to operate similar to SLC memory cells and store only a single bit each, which is an easier task from a technological point of view. As a result, the MLC memory cells can be implemented to achieve the faster write performance characterizing the SLC flash memory. The Lee patent is incorporated by reference for all purposes as if fully set forth herein.

Known in the art techniques, such as that disclosed in the Lee patent, provide a "built-in" faster cache memory embedded within the MLC flash memory storage system. When data bits are received for storage, they are first written into memory cells that are set to operate in SLC mode. This first writing operation can be done relatively fast. Following this operation, in the background and when time permits it, the data bits are copied from the SLC cells into memory cells that are set to operate in MLC mode. Thus, as the system is designed to employ the higher storage density of the MLC flash memory storage system, the system further handles the faster input stream that could not be handled without the cache memory mechanism.

There are two possible methods for configuring a flash memory system while utilizing such an SLC caching scheme:

A. A dedicated cache method—where a specific portion of the memory cells is always allocated to operate in SLC mode, while other cells are allocated to operate in MLC mode only. In other words, while memory cells operating in SLC mode (SLC cells) and memory cells operating in MLC mode (MLC cells) co-exist within the storage system at the same time, each specific memory cell is either allocated to operate in SLC mode or in MLC mode, and cannot be alternately allocated to operate in SLC mode at one point in time and in MLC mode at another point in time.

B. A mixed cache method—where at least some of the memory cells change modes during the system's operation. That is—a specific memory cell may be allocated to operate in SLC mode at one point in time and utilized for caching data, while at a second point in time the same memory cell may be allocated to operate in MLC mode and utilized for high density data storage in the main memory.

The dedicated cache method is much simpler to manage in flash memory systems than the mixed cache method. Each portion of the memory cells is pre-allocated to operate either in SLC mode or in MLC mode. Therefore, no real-time mode switching is required. Furthermore, there is no need to provide an information management module for storing and detecting the current operation mode of any memory portion.

The Lee patent discloses a cache implementation that uses the mixed cache method. U.S. patent application Ser. No. 11/318,906 to Lasser discloses a cache implementation that uses the dedicated cache method. The Lasser Application is incorporated by reference for all purposes as if fully set forth herein.

However, both cache implementation methods (i.e. mixed cache method and dedicated cache method) suffer from disadvantages explained herein below. Whenever in this application there is a reference to a cache, it can be either a mixed cache or a dedicated cache.

As explained above, the way a cache memory in a flash memory operates is the following—incoming data is written into the faster-to-write cache storage locations. Later, either when there is idle time or when the cache memory is full and free space must be cleared, the data is read out of the cache memory and written into the slower-to-write main storage locations. After data is copied, the data is no longer needed to be stored in the cache memory and can be deleted so as to make its space available for new incoming data.

The operation of copying data from the cache memory into the main storage area and then clearing the copied area in the cache memory is defined herein as "cache cleaning". Cache cleaning is typically a relatively time-consuming operation, as this operation includes both the writing of data into the slow-to-write MLC main memory area and the erasing of the copied data from the cache memory area, both operations typically being much slower than reading or even writing data into the SLC cache.

According to known in the art techniques, the cache cleaning is handled automatically and autonomously by the storage device, with the software applications running on the computer hosting the storage device having no control over the timing or any other aspect of the process. The internal controlling mechanism of the storage device determines when there is idle time in which no host computer requests have to be serviced and uses such time for cache cleaning. Additionally, cache cleaning is also initiated by the internal controlling mechanism of the storage device when new data is received from the host computer and there is not enough room in the cache memory for storing the new data. In such case, cache cleaning is applied for making room for the new data in the cache memory.

This way of autonomous cache cleaning causes some disadvantages in certain scenarios of the memory device usage.

A. Consider a scenario where a storage device having an internal cache is used in a portable appliance (such as an audio MP3 player or a video MP4 player). The typical use pattern of the appliance is to download the appliance with a large amount of data and then use the appliance for some period of time only for reading portions of the data. The writing of the data into the appliance is done at a workstation in the office with no time pressure, and the use of the appliance in which portions of the data are read is done in the field upon an instant demand, where the fastest read rate and response time is required.

In such a ease, an appliance using a memory device with an internal cache memory operating according to the methods of the prior art might exhibit the following behavior—when downloading the bulk of the data in the office, the cache is filled with data. Once the transfer of the data from the workstation to the appliance is complete, the user disconnects the appliance from the workstation and powers down the appliance. The cache memory is left with a lot of data stored in it, as no cache cleaning can be done without power. At some later time the user takes the appliance to the field and powers the appliance up, using a built-in battery. Once power is up, the internal controlling mechanism of the memory device determines that a lot of data is still stored in the cache memory and starts scheduling cache cleaning operations. Now when the user requests to display some data that has to be read from the memory device, the memory performance is not optimal. A read request received immediately after a cache cleaning operation started, instructs the controlling mechanism either to keep the read request waiting for a while until the cache cleaning operation ends and the memory is not busy any more, or to abort the cache cleaning operation while taking care to preserve the integrity of the data despite the interruption. In both cases the result might be a longer time until the read request is serviced. The average speed of reading data out of the memory device might also suffer, if cache cleaning operations are interleaved by the memory internal controller between the servicing of read requests.

All these undesired effects are really not necessary—as no new data is written into the storage device in such case, no harm would occur if no cache cleaning is to be applied. The cached data could safely remain in the cache memory until a right time is found for cache cleaning, i.e. when such cache cleaning does not interfere with the use of the hosting appliance. However, there is no way in the prior art memory devices to avoid these disadvantages.

B. Consider a scenario where an appliance includes a storage device with an internal cache memory. Assume the cache memory size is 20 Mbytes. The user desires to activate a software application that generates a very large amount of data that is to be stored in the storage device. Assume the amount of data expected to be generated by the application is 15 Mbytes. Also assume the rate of generating data by the application is faster than the write rate of the MLC main storage area but is not faster than the write rate of the SLC cache storage area.

If the user activates the software application when the cache memory is empty, everything will function well: the 15 Mbytes of generated data is transferred into the cache memory at the rate the data are generated, and the cache memory is fast enough to accept all the data. However, in case the user activates the application a second time immediately following the first time, or in case the user turns the appliance power off immediately after activating the application a first time and turns the appliance on again just before a second activation, then approximately 15 Mbytes of data are stored in the cache memory when the second activation starts. The first 5 Mbytes generated by the second activation are handled by the cache memory at the rate of their generation, but then the memory device slows down. For every new chunk of data received in the storage device generated after the first 5 Mbytes, room must first be made. As the process of freeing storage area involves writing data into the main storage area that is assumed to be slower than the data generation rate, the system is not able to cope with the incoming data rate and eventually data is lost.

As in the previous example above, these undesired effects are not really necessary. The user may have agreed to wait with the second activation had he/she known that this is required for a successful activation without any data loss. However, prior art memory devices do not provide any indication about the state of the cache—whether it is empty or full. Additionally, prior art memory devices do not provide any way for a host software application to force an immediate cache cleaning in the memory device.

Therefore, it is desirable to provide a storage system employing a cache memory, while overcoming the problems resulting from the autonomous operation of the cache controller of prior art techniques.

SUMMARY OF THE INVENTION

Accordingly, it is a principal object of the present invention to overcome the disadvantages of prior art techniques resulting from the autonomous operation of the cache controller.

The present invention is a flash memory storage device, including an internal SLC cache memory and an MLC main memory, which provides host software applications some control over the scheduling of the cache cleaning operations performed in the storage device in response to caching commands received from the host.

A "caching command" is defined herein as a command, received by a memory device from a host, which is related to the manner in which the memory device temporarily caches data written by the host to the memory device and then transfers the cached data to long-term storage within the device. For example, a "cache command" could modify the manner in which the memory device caches data received from the host, or a "cache command" could tell the host something about how the memory device caches data received from the host. A "write command", to a memory device that performs such caching, that merely transfers data from the host to the memory device, is specifically excluded from this definition.

As an example, these caching commands include a "Disable Cache cleaning" command instructing the flash memory device to reversibly disable future cache cleaning operations, an "Enable Cache Cleaning" command instructing the flash memory device to cancel the "Disable Cache cleaning" and thus enable cache cleaning operations, a "Flush Cache" command instructing the flash memory device to temporarily stop servicing new requests received from the host until the storage area of the cache memory is empty, a "Get Cache Status" command providing an indication of the status of the cache memory, etc.

In accordance with the present invention, there is provided a flash memory device that includes: (a) a storage area having: (i) a main memory portion and (ii) a cache memory portion that is operative to store at least one bit per cell less than the main memory portion; and (c) a controller that is operative to manage data transfer between the cache memory portion to the main memory portion according to at least one caching command received from a host. The management of data, by the controller, includes transferring new data from the host to the cache memory portion, copying the data from the cache memory portion to the main memory portion and controlling (enabling/disabling) the scheduling of cache cleaning operations.

The management of data is applied in accordance with a variety of commands received from the host. As an example, these caching commands include a "Disable Cache cleaning" command instructing the flash memory device to reversibly disable future cache cleaning operations, an "Enable Cache Cleaning" command instructing the flash memory device to cancel the "Disable Cache cleaning" and thus enable cache cleaning operations, a "Flush Cache" command instructing the flash memory device to temporarily stop servicing new requests received from the host until the storage area of the cache memory is empty, a "Get Cache Status" command providing an indication of the status of the cache memory, etc.

Preferably, the caching command includes a disabling command instructing the controller to reversibly disable, at least in part, the data transfer from the cache memory portion to the main memory portion. More preferably, the caching command includes an enabling command instructing the controller to cancel, at least in part, operation of the disabling command.

Preferably, the caching command includes a flush command instructing the controller to immediately effect the data transfer from the cache memory portion to the main memory portion.

Preferably, the main memory portion and the cache memory portion are fixed portions of the storage area. Alternatively, the main memory portion and the cache memory portion are allocated using a mixed cache method.

In accordance with the present invention, there is further provided a method of managing operation of a flash memory device that includes a storage area having a main memory portion and a cache memory portion operative to store at least one bit per cell less than the main memory portion, the method includes the steps of: (a) receiving data from a host; (b) storing the received data in the cache memory portion; and (c) according to at least one caching command received from the host, managing transfer of data between the cache memory portion and the main memory portion.

Preferably, the caching command includes a disabling command that disables, at least in part, the transfer of data from the cache memory portion to the main memory portion.

More preferably, the command includes an enabling command that cancels, at least in part, the disabling command.

Preferably, the caching command includes a flush command that immediately effects the transfer of data from the cache memory portion to the main memory portion.

Preferably, the caching command includes a request for an indication of the status of the cache memory portion.

In accordance with the present invention, there is further provided a flash memory device that includes: (a) a storage area having a main memory portion and a cache memory portion operative to store at least one bit per cell less than the main memory portion; and (b) a controller that is operative to transfer data between the cache memory portion and the main memory portion and, in response to a status command received from a host, to send the host an indication of an amount of data that is stored in the cache memory portion.

Preferably, the main memory portion and the cache memory portion are fixed portions of the storage area. Alternatively, the main memory portion and the cache memory portion are allocated using a mixed cache method.

In accordance with the present invention, there is further provided a method of managing operation of a flash memory device that includes a storage area having a main memory portion and a cache memory portion operative to store at least one bit per cell less than the main memory portion, the method includes the steps of: (a) receiving data from a host; (b) storing the received data in the cache memory portion; and (c) in response to a status command received from the host, sending the host, an indication of an amount of data that is stored in the cache memory portion.

Additional features and advantages of the invention will become apparent from the following drawings and description.

BRIEF DESCRIPTION OF THE DRAWINGS

For a better understanding of the invention with regard to the embodiments thereof, reference is made to the accompanying drawing, in which like numerals designate corresponding sections or elements throughout, and in which.

DETAILED DESCRIPTION OF THE PREFERRED EMBODIMENTS

Figure 1:
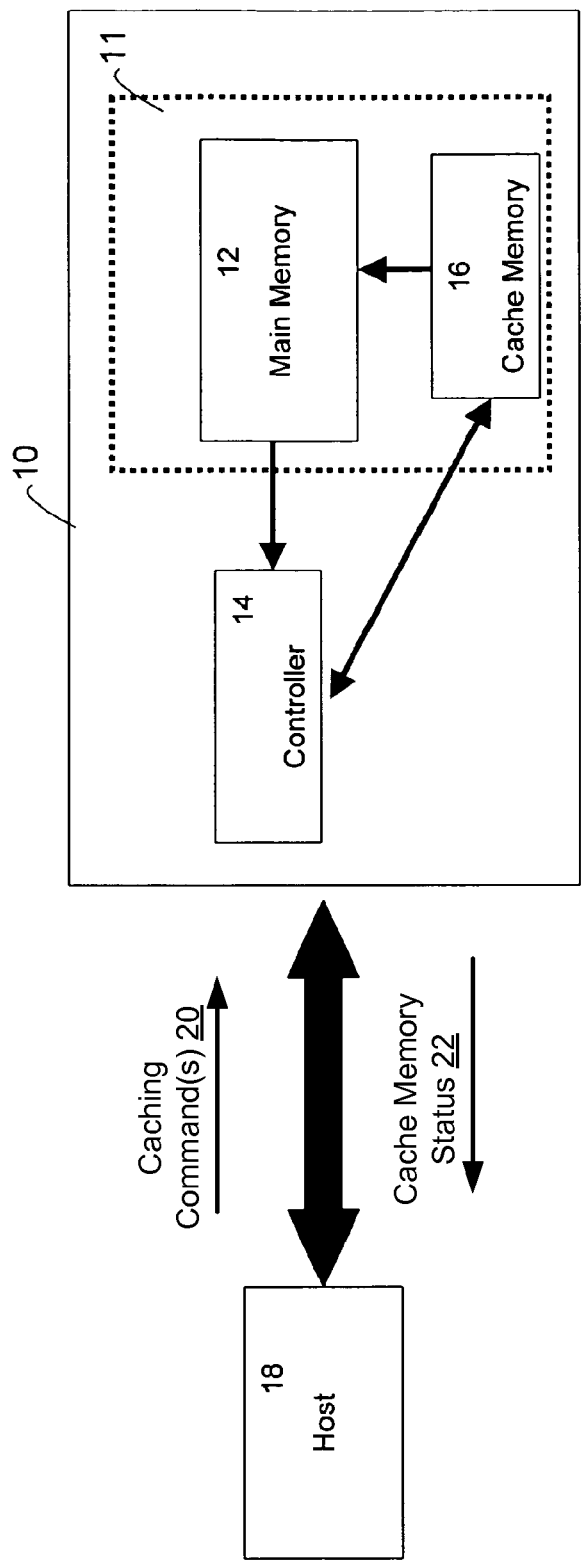
FIG. 1 is a block diagram of a flash memory device of the present invention connected to a host.

The present invention is a flash memory storage device, including an internal SLC cache memory and an MLC main memory, that provides host software applications some control over the scheduling of the cache cleaning operations performed in the storage device.

The storage device of the present invention supports a group of caching commands that a host computer may issue to the storage device in order to influence the scheduling of its cache cleaning operations.

As an example, caching commands providing solutions for the scenarios described above include a "Disable Cache cleaning" command, an "Enable Cache Cleaning" command, a "Flush Cache" command, and a "Get Cache Status" command. However, it should be understood that this group of commands is provided as an example only and many other groups with either these or other commands may be used. The innovation of the present invention is in the provision of a way for a software application running on a system hosting a memory device with an internal cache memory to influence the way cache cleaning is scheduled to its advantage.

A "Disable Cache Cleaning" command is provided to instruct the storage device to reversibly disable future cache cleaning operations. If a cache cleaning operation is in progress when the command is received, the memory device may either abort the cache cleaning operation or complete this operation, according to the designer's choice. When cache cleaning is disabled, all incoming data is routed to the cache memory as in the prior art, but no data is taken out of the cache memory to make free storage area available for new data unless there is no other choice. In other words, cache cleaning is not automatically initiated during idle time, but is conditional on an immediate need to make cache storage area available for storing new incoming data.

An "Enable Cache Cleaning" command—is provided to instruct the memory device to cancel the Disable Cache Cleaning command, thereby enabling normal cache cleaning operations, including cache cleaning during idle time. Following the receiving of this command, the memory device operates similar to the devices of the prior art, where cache cleaning operations are autonomously initiated by the device's controller.

A "Flush Cache" command is provided to instruct the memory device to stop servicing new requests from the host until the storage area of the cache memory is empty. All available time and other resources of the memory device are allocated for cache cleaning operation. As long as the cache memory is not fully empty, the storage device asserts the host a currently busy signal as an indication to the host that the storage device cannot accept new service requests.

A "Get Cache Status" command is provided to instruct the memory device to send the host computer information about the status of the cache. A simple implementation of such command may return only indications of "completely empty", "completely full" and "partially full". A more advanced implementation of such command provides the host a more precise numerical measurement of the status of the cache memory. For example, a scale of 0 to 100 is defined, with 0 indicating "completely empty", the value 100 indicating "completely full", the value 50 indicating "half full", the value 25 indicating "a quarter full", etc. Alternatively, the scale may be related to some physical feature of the cache memory. For example, if the cache memory is configured to store 5,000 units of data (e.g. sectors), then a measure of 2,000 indicates there are 2,000 units currently stored in the cache memory and there is storage area available for 3,000 additional units.

Hence, the commands listed herein above can be utilized by the storage device of the present invention to overcome the disadvantages of the prior art in the following manner:

In scenario A of a portable appliance operated in the field only to read data out of the memory device, the reading application of the appliance may issue to the memory device a "Disable Cache Cleaning" command immediately before issuing reading requests. The disabling command results in optimized performance and latency in servicing the read requests, as no cache cleaning operations now interfere with these read requests. When reconnecting the portable appliance to a workstation for downloading new data, the application of the appliance firstly issues an "Enable Cache Cleaning" command, so that data writing occurs with cache cleaning enabled.

In scenario B of a portable appliance generating large amounts of data to be stored in the memory device, the software application of the appliance may issue a "Flush Cache" command before starting data generation. This causes the memory device to become busy (assuming the cache memory is not already empty) and the software application of the appliance to wait for the memory device to become ready before generating new data. Once the memory device becomes ready, the application is assured the storage area of the cache memory is completely empty and there is enough storage area available now in the cache memory for storing all of the new generated data.

An alternative method for handling the scenario B is for the software application of the portable appliance to issue a "Get Cache Status" command at any time before generating new data or at predetermined points during the process of data generation. According to the status of the cache memory received from the memory device, the software application of the portable appliance determines whether to proceed generating more data or rather to wait until enough storage area is made available in the cache memory by the autonomous cache cleaning mechanism. For example, an application may elect to stop and wait whenever the status of the cache memory indicates that the cache memory is 50% or more full. Before each major step of the data generation process the application then loops around a "Get Cache Status" command, exiting the loop only when the status of the cache memory indicates the cache memory is less than 50% full.

Referring to FIG. 1, there is shown a block diagram of a flash memory storage device 10 of the present invention connected to a host 18. Flash memory storage device 10 includes a storage area 11 and a controller 14 for controlling operation of the flash memory storage device.

The storage area 11 includes a main memory 12 (typically operating in MLC mode) and a cache memory 16 operating at a higher rate than the main memory 12.

The cache memory 16, operating at a higher rate than main memory 12, is provided for storing incoming data stream received from the host 18. The input data stream received from the host 18 is first written into the cache memory 16 (typically operating in SLC mode) and at a later stage is copied from this (faster) cache memory 16 into the (slower) main memory 12.

The controller 14 manages the scheduling of cache cleaning operations between the cache memory 16 and the main memory 12 in response to caching commands 20 received from the host 18. As described herein above, the caching commands 20 include a "Disable Cache cleaning" command instructing the controller 14 to reversibly disable data transfer from the cache memory 16 to the main memory 12, an "Enable Cache Cleaning" command instructing the controller 16 to cancel the Disable Cache cleaning command, a "Flush Cache" command instructing the controller 16 to immediately effect the data transfer between the cache memory 16 and the main memory 12, and a "Get Cache Status" command for receiving an indication of the status 22 of the cache memory 16.

Controller 14 manages main memory 12 as taught in U.S. Pat. No. 5,404,485 to Ban and in U.S. Pat. No. 5,937,425, also to Ban, both of which are incorporated by reference for all purposes as if fully set forth herein. (U.S. Pat. No. 5,404,485 applies to the management of flash memories generally. U.S. Pat. No. 5,937,425 is specific to NAND flash memories). The controller 14 exchanges data stored in the main memory 12 with the host 18 in the conventional manner. For example, if flash memory storage device 10 is used for non-volatile data storage in a system such as a personal computer, then controller 14 communicates with the other components of the system via the system's bus. If the flash memory storage device 10 is a portable storage device that is reversibly attached to host 18 using a suitable interface (for example using the USB interface taught in U.S. Pat. No. 6,148,354, to Ban et al., which is incorporated by reference for all purposes as if fully set forth herein), then controller 14 communicates with the host 18 via that interface.

It is thus seen that by providing caching commands allowing a software application on a host computer to influence and effect the control of the internal cache of a memory device, the operation of the software application may be greatly optimized.

It should be noted that even though currently available MLC flash memory devices store two bits per cell, the storage device of the present invention is not limited to such case. The MLC flash memory storage device is further operative to store three bits per cell, four bits per cell, or any other number of bits per cell that is higher than one. Similarly, the cache memory need not necessarily store one bit per cell. The cache memory is further designed to store any number of bits per cell as long as this number is less than the number of bits stored per cell in the main memory. As long as this relation holds, the cache memory operates faster than the main memory and the benefit of caching high rate input streams can be achieved.

Figure 2:
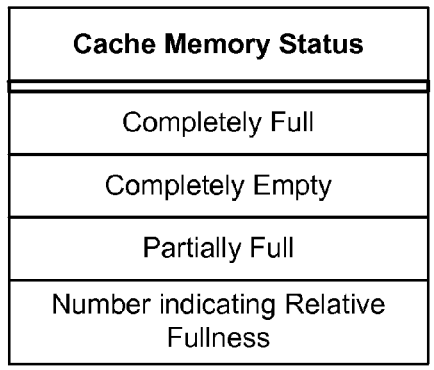
FIG. 2 illustrates possible values of the status of the cache memory.

FIG. 2 illustrates possible values of the status 22 of the cache memory 16.

Figure 3:
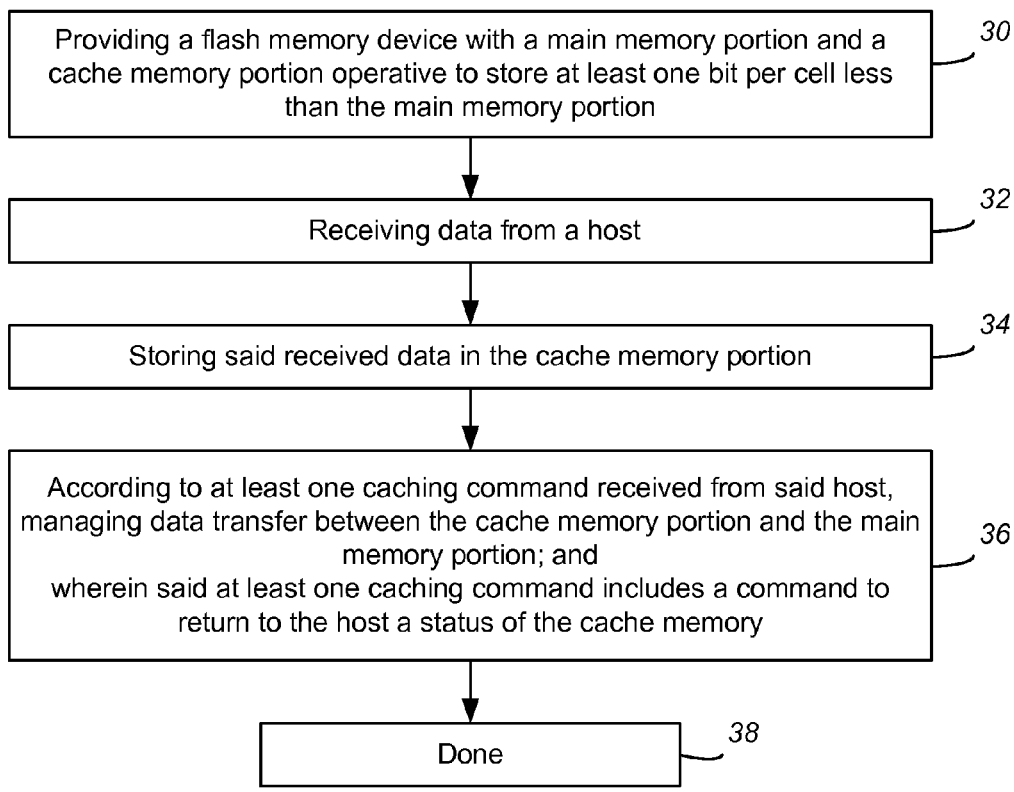
FIG. 3 is a flow diagram illustrating a method of operating the flash memory with host controlled caching.

FIG. 3 is a flow diagram illustrating a method of operating the flash memory with host controlled caching.

STEP 30: Providing a flash memory device with a main memory portion and a cache memory portion operative to store at least one bit per cell less than the main memory portion.

STEP 32: Receiving data from a host.

STEP 34: Storing said received data in the cache memory portion.

STEP 36: According to at least one caching command received from said host, managing data transfer between the cache memory portion and the main memory portion; and wherein said at least one caching command includes a command to return to the host a status of the cache memory.

STEP 38: Done.

Having described the invention with regard to certain specific embodiments thereof, it is to be understood that the description is not meant as a limitation, since further modifications will now suggest themselves to those skilled in the art, and it is intended to cover such modifications as fall within the scope of the appended claims.

What is claimed is:

1. A flash memory device comprising:
   (a) a storage area including:
      (i) a main memory portion; and
      (ii) a cache memory portion, where said cache memory portion is operative to store at least one bit per cell less than said main memory portion; and
   (b) a controller operative to manage data transfer between said cache memory portion and said main memory portion according to at least one caching command received from a host, and
   wherein said at least one caching command includes a command to return to the host a status of the cache memory.

2. The flash memory device of claim 1, wherein said status includes indications of the cache memory being completely empty.

3. The flash memory device of claim 1, wherein said status includes indications of the cache memory being completely full.

4. The flash memory device of claim 1, wherein said status includes indications of the cache memory being partially full.

5. The flash memory device of claim 1, wherein said status includes a numerical measurement of the relative fullness of the cache memory.

6. The flash memory device of any one of claims 1-5, wherein said main memory portion and said cache memory portion are fixed portions of said storage area.

7. The flash memory device of any one of claims 1-5, wherein said main memory portion and said cache memory portion are allocated using a mixed cache method.

8. A method of managing operation of a flash memory device that includes a storage area having a main memory portion and a cache memory portion operative to store at least one bit per cell less than the main memory portion, the method comprising the steps of:
   (a) receiving data from a host;
   (b) storing said received data in the cache memory portion; and
   (c) according to at least one caching command received from said host, managing data transfer between the cache memory portion and the main memory portion; and
   wherein said at least one caching command includes a command to return to the host a status of the cache memory.

9. The method of claim 8, wherein said status includes indications of the cache memory being completely empty.

10. The method of claim 8, wherein said status includes indications of the cache memory being completely full.

11. The method of claim 8, wherein said status includes indications of the cache memory being partially full.

12. The method of claim 8, wherein said status includes a numerical measurement of the relative fullness of the cache memory.

13. The method of any one of claims 8-12, wherein said main memory portion and said cache memory portion are fixed portions of said storage area.

14. The method of any one of claims 8-12, wherein said main memory portion and said cache memory portion are allocated using a mixed cache method.

* * * * *

UNITED STATES PATENT AND TRADEMARK OFFICE
CERTIFICATE OF CORRECTION

PATENT NO. : 8,595,445 B2
APPLICATION NO. : 13/419733
DATED : November 26, 2013
INVENTOR(S) : Menahem Lasser It is certified that error appears in the above-identified patent and that said Letters Patent is hereby corrected as shown below:

Title page at (73), correcting the Assignee, delete "SanDisk Corporation" and insert
--SanDisk IL LTD--.

Signed and Sealed this
Seventeenth Day of June, 2014

Michelle K. Lee
*Deputy Director of the United States Patent and Trademark Office*